United States Patent [19]

Nagashima et al.

[11] Patent Number: 4,690,591

[45] Date of Patent: Sep. 1, 1987

[54] METHOD AND APPARATUS FOR TRANSPORTING AN ARTICLE IN VACUUM

[75] Inventors: Masayasu Nagashima, Yokohama; Nobuo Iijima, Tama, both of Japan

[73] Assignee: Fujitsu Limited, Kawasaki, Japan

[21] Appl. No.: 498,728

[22] Filed: May 27, 1983

[30] Foreign Application Priority Data

May 28, 1982 [JP] Japan ................................. 57-91629

[51] Int. Cl.⁴ ............................................ B65G 51/03
[52] U.S. Cl. ....................................... 406/88; 34/236; 34/57 R
[58] Field of Search ................... 406/88; 34/156, 236, 34/57 R; 156/636

[56] References Cited

U.S. PATENT DOCUMENTS

| | | | |
|---|---|---|---|
| 3,759,579 | 9/1973 | Johnston | 406/88 |
| 3,773,391 | 11/1973 | Crandall et al. | 406/88 |
| 3,947,236 | 3/1976 | Lasch, Jr. | 406/88 X |
| 3,975,057 | 8/1976 | Hurd | 406/88 X |
| 3,980,024 | 9/1976 | Futer | 406/88 X |
| 4,010,981 | 3/1977 | Hodge | 406/88 |
| 4,069,595 | 1/1978 | Ahlbert et al. | 34/156 |
| 4,293,249 | 10/1981 | Whelan | 406/88 |
| 4,414,757 | 11/1983 | Whipple | 34/156 |

FOREIGN PATENT DOCUMENTS 350797  1/1961  Switzerland ........................ 34/156

Primary Examiner—Jeffrey V. Nase
Attorney, Agent, or Firm—Staas & Halsey

[57] ABSTRACT

A method for transporting an article disposed on an upper surface of a stage in a vacuum. Gas is ejected through a plurality of inclined nozzles formed in the stage so that the article is transported in the direction of inclination of the nozzles.

5 Claims, 5 Drawing Figures

METHOD AND APPARATUS FOR TRANSPORTING AN ARTICLE IN VACUUM

BACKGROUND OF THE INVENTION

1. Field of the Invention

The present invention relates to a method and an apparatus for automatically transporting an article, such as a wafer for producing a semiconductor device, in a vacuum chamber for vacuum treatment of the article. "Vacuum" herein means a rarified atmospheric condition such as that in a chamber below atmospheric pressure, such state being obtained by exhausting the chamber using an air pump.

A semiconductor chip of an integrated circuit device is produced by a process in which a semiconductor wafer is chemically or physically treated in vacuum. For example, a process for coating a film on the wafer or etching the wafer is carried out in a vacuum chamber of a vacuum treatment apparatus, such as a chemical vapor deposition (CVD) apparatus, a dry-etching apparatus, an evaporation apparatus, or a sputtering apparatus. An ion injection method or an electron beam irradiation method for producing a semiconductor chip also carried out in a vacuum.

Today, rapid technical developments in the field of semiconductor devices require automatic treatment of a wafer in order to upgrade the reliability of semiconductor devices and in order to decrease the number of processes for producing the devices, since a large number of fine chips are produced from a wafer. Therefore, the operation of handling the wafer, such as inserting the wafer into the apparatus or removing the wafer from the apparatus, as well as the time and temperature of treatment of the wafer, is controlled by a computer.

The most troublesome part of controlling a vacuum treatment apparatus by computer is the transportation of the water in the vacuum.

2. Description of the Prior Art

Conventionally, a wafer is transported by a mechanical device, such as a claw or a conveyor belt. Such a mechanical device requires lubrication. However, a lubricant cannot be used in the vacuum chamber since it boils off and affects the water in the vacuum. Also, the wafer is treated at a high temperature and corrosive gases are used during the treatment of the wafer, which high temperature and gases affect the claw or conveyor belt. Therefore, the conventional mechanical device for transporting a wafer is not reliable and the parts of the transportation device must often be repaired or replaced.

SUMMARY OF THE INVENTION

The present invention proposes a method and an apparatus for transporting an article in a vacuum treatment apparatus, in which method and apparatus the above-mentioned problems are obviated so that the wafer is reliably and easily transported in the vacuum.

According to the present invention, there is provided a method for transporting an article disposed on the horizontal upper surface of a stage in a vacuum. Gas is ejected through a plurality of inclined nozzles formed in the stage so that the article is transported in the direction of inclination of the nozzles. Embodiments of the present invention are described hereinafter with reference to the attached drawings.

DESCRIPTION OF THE PREFERRED EMBODIMENTS

Figure 1:
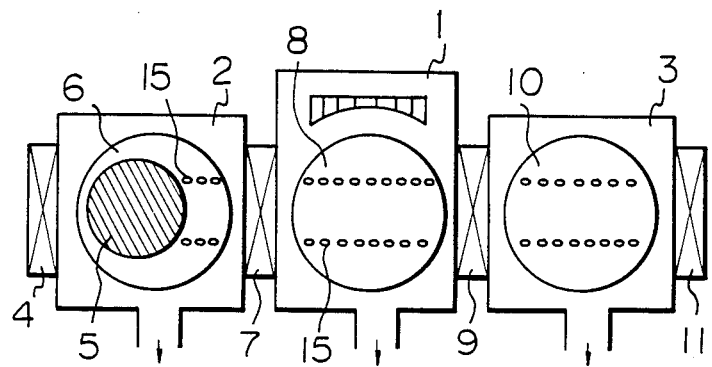
FIG. 1 is a plan view of a vacuum treatment apparatus according to the present invention.

FIG. 1 is a plan view of a vacuum treatment apparatus having a reaction chamber 1 and two supplementary chambers 2 and 3 disposed on opposite sides of the reaction chamber 1. An article (semiconductor wafer) 5 is automatically transported into the reaction chamber 1 from the supplementary chamber 2 and is discharged from the reaction chamber 1 into the supplementary chamber 3 (described in detail later). For example, the surface of the wafer 5 is to be etched by an ion etching method, i.e., a kind of dry-etching method, using argon gas in the reaction chamber 1.

First, a gate valve 4 of the supplementary chamber 2 is opened and the wafer 5 is conveyed into the supplementary chamber 2 by hand or by a conveyor device (not shown) through the gate valve 4 and is placed on a wafer stage 6. Then the gate valve 4 is closed and the supplementary chamber 2 is exhausted moving from atmospheric pressure to a high vacuum ($10^{-6}$ to $10^{-7}$ torr). Next, a gate valve 7 disposed between the supplementary chamber 2 and the reaction chamber 1 is opened. The reaction chamber 1 is exhausted beforehand to the high vacuum. Therefore, the reaction chamber 1 and the supplementary chamber 2 are maintained at the high vacuum when the gate valve is opened. Then the wafer 5 is transported from the wafer stage 6 of the supplementary chamber 2 to a wafer stage 8 disposed in the reaction chamber 1 by a transportation apparatus according to the present invention.

Next, the gate valve 7 is closed and the wafer 5 is etched within the reaction chamber 1 by the ion etching method. Then a gate valve 9 disposed between the reaction chamber 1 and the supplementary chamber 3 is opened. The wafer 5 etched in the vacuum treatment is transported from the wafer stage 8 of the reaction chamber 1 onto a wafer stage 10 disposed in the supplementary chamber 3, which is exhausted to the high vacuum beforehand. Then gate valve 9 is closed and a gate valve 11 of the supplementary chamber 3 is opened so that the pressure inside the supplementary chamber 3 rises to the atmospheric pressure level. The wafer 5 is taken out of the supplementary chamber 3 through the gate valve 11.

Figure 2:
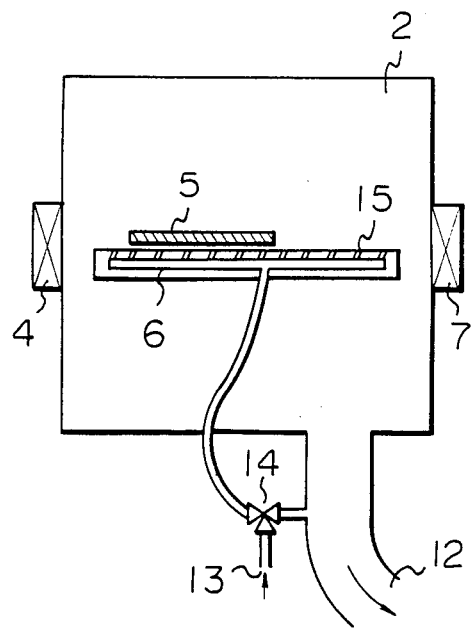
FIG. 2 is an enlarged elevational view of a supplementary chamber of the apparatus of FIG. 1.

The present invention is applied to the transportation of the wafer 5 from the wafer stage 6 to the wafer stage 8 and from the wafer stage 8 to the wafer stage 10. The transportation method according to the present invention is described hereinafter with reference to FIG. 2, which is an elevational view of the supplementary chamber 2. The gate valve 7 is opened after the supplementary chamber 2 is exhausted to the high vacuum through a vacuum pipe 12. Then argon gas is introduced into the inside of the wafer stage 6 through a three-way valve 14 from a gas inlet 13. A number of inclined nozzles 15 are formed in the wafer stage 6. The argon gas is injected through the inclined nozzles 15 so that the wafer 5 is floated and moved in the direction of inclination of the nozzles 15. In this manner, the wafer 5 is transported to the wafer stage 8 in the reaction chamber 1. The surfaces of the wafer stages 6 and 8 should be at the same level. Alternatively, the surfaces of the wafer stages 6 and 8 may be inclined in the conveying direction so that smooth conveyance of the wafer can be achieved. The inclination angle of the stage surfaces 6 and 8 and the pressure of the gas can be determined by simple experiments to take into consideration the roughness of the stage surfaces 6 and 8.

In an experiment, a wafer four inches in diameter was conveyed by an arrangement of two rows of nozzles 15 disposed in the conveying direction, each nozzle having an opening diameter of 0.5 mm and being disposed at an interval of 20 mm. It is desirable that the inclination angle of the nozzles 15 be between 30° and 45° and that the wafer stages 6 and 8 be disposed in the vicinity of the gate valve 7.

The vacuum level within the supplementary chamber 2 is suddenly lowered to $10^{-2}$ to $10^{-3}$ Torr by the ejection of argon gas through the nozzles 15. This vacuum level is similar to that of the reaction chamber 1 at the time of vacuum treatment, which is carried out in the argon gas atmosphere within the reaction chamber 1. After the wafer 5 is transported into the reaction chamber 1, the gate valve 7 is closed and the three-way electromagnetic valve 14 is changed so that the supplementary chamber 2 is exhausted to a high vacuum level through the vacuum pipe 12. Advantageously, the reaction time within the reaction chamber 1 is shortened since the wafer is preliminarily reacted in the argon gas atmosphere within the supplementary chamber 2.

The wafer 5 is transported from the wafer stage 8 to the wafer stage 10 in a manner similar to transportation of the wafer 5 from the wafer stage 6 to the wafer stage 8. Hydrogen gas or silane gas may be used instead of the neutral argon gas when a CVD apparatus is used as the vacuum treatment apparatus.

As was mentioned before, the vacuum level of a vacuum treatment apparatus, such as a CVD apparatus or a dry-etching apparatus, is relatively low ($10^{-2}$ to $10^{-3}$ torr). This is because in a CVD apparatus used for forming a multi-crystal film of silicon on a semiconductor wafer, mono-silane gas ($SiH_4$) is introduced into the apparatus using hydrogen gas as a carrier gas, so that the mono-silane gas is disintegrated and silicon is deposited on the semiconductor wafer surface. Similarly, carbon fluoride gas ($CF_4$) is introduced into the apparatus, using argon gas as a carrier gas, in the case of a plasma etching apparatus (a kind of dry-etching apparatus) used for etching a wafer of silicon with carbon fluoride gas.

In accordance with the present invention, the above-mentioned reaction gas or carrier gas is used for conveying the wafer by ejecting the gas through the inclined nozzles 15. It is important that the gas used for conveying the wafer 5 be the same as the reaction gas or carrier gas since the reaction time within the reaction chamber is thereby shortened and the wafer is not unfavorably influenced by the gas. The material of the wafer stages 6, 8 and 10 should be selected considering the nature of the gas, and the ejection pressure should be determined experimentally considering the volume of the chamber and the weight of the wafer 5.

Figure 3:
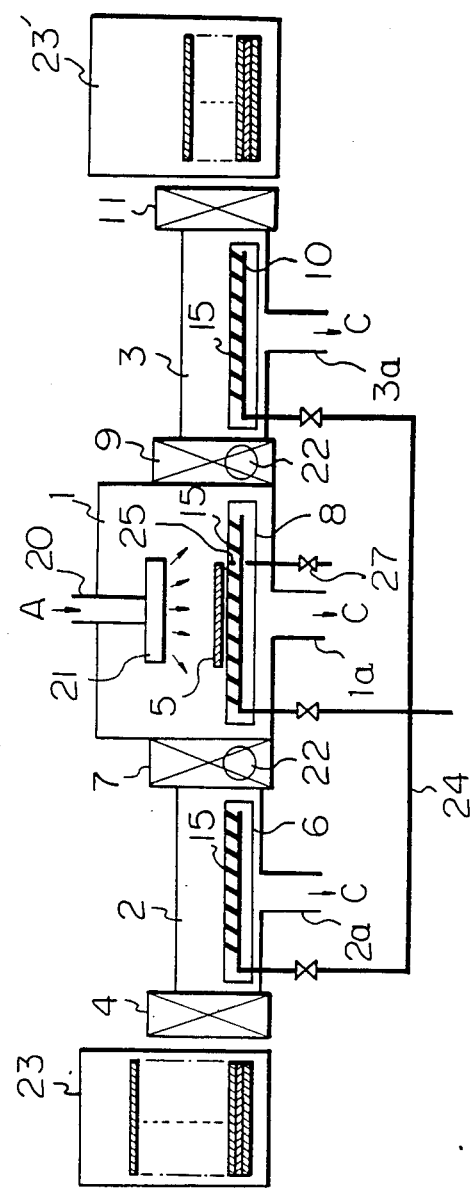
FIG. 3 is an elevational view of another embodiment of the present invention.

FIG. 3 is an elevational view of another vacuum treatment apparatus to which the present invention is applied. A wafer 5 is taken out of a wafer cassette 23, in which a number of wafers are stacked. The wafer 5 is received into another wafer cassette 23' after carrying out of the vacuum treatment in the reaction chamber 1. The reaction gas is introduced into the reaction chamber 1 through an inlet pipe 20 and is ejected through an electrode member 21 so that a chemical treatment of the wafer 5 is carried out. An idle roller 22 is disposed between the wafer stages 6 and 8 and another idle roller 22 is disposed between the wafer stages 8 and 10 so as to smoothly transport the wafer between the wafer stages.

Figure 4:
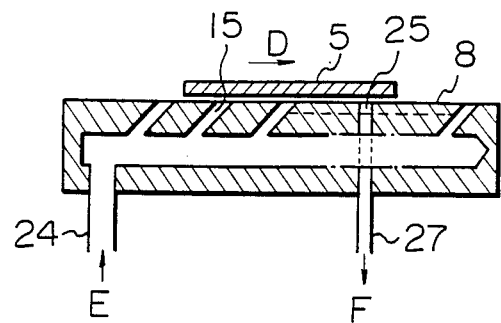
FIG. 4 is a sectional view of stage 8 of the apparatus in FIG. 3.
Figure 5:
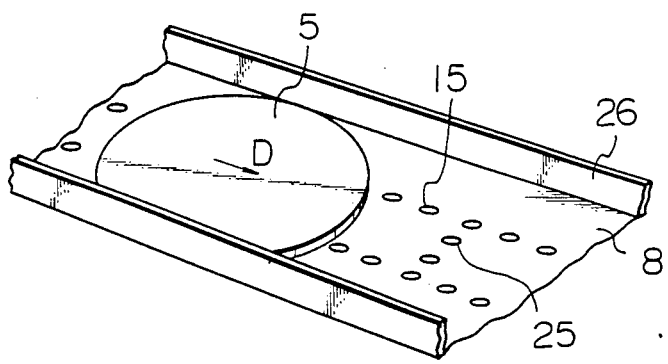
FIG. 5 is a partial top view of stage 8 of the apparatus in FIG. 3.

The wafer 5 is transported in the direction of the arrow D (FIGS. 4 and 5) by the pressure of the gas ejected through the nozzles 15, which gas is the same as the reaction gas, and is introduced into the inside of the wafer stages 6, 8, and 10 through a pipe 24. Each chamber 1, 2, and 3 includes a vacuum port 1a, 2a, and 3a, respectively, which is connected to a vacuum pump (not shown) through a valve (not shown) to exhaust each chamber 1, 2, and 3, as is shown by the arrows C. One or more suction ports 25 are formed on the surface of the wafer stage 8 (FIGS. 4 and 5) to promptly exhaust the gas in the reaction chamber 5 after transportation of the wafer 5. The suction port 25 is connected to a vacuum pump (not shown) through a vacuum pipe 27. Transportation of the wafer 5 is stopped by stopping the ejection of gas through the nozzles 15. After that, the gas in the chamber is exhausted through the suction ports 25. As was mentioned above, the transportation method of the present invention is conducted in a vacuum and does not require any mechanical parts, thereby enabling the article to be easily and reliably transported.

The present invention is especially effective when applied to the transportation of an article in a vacuum treatment apparatus which uses a reaction gas since the reaction gas can also be used for conveying the article, thereby promoting the reaction, and the article can be successfully conveyed by a low gas pressure since the atmosphere surrounding the article is a vacuum.

What is claimed is:

1. A method for transporting an article disposed on an upper surface of a stage, housed in an enclosed chamber, having a plurality of inclined nozzles, said method comprising the steps of:
    (a) reducing pressure of the enclosed chamber below atmospheric pressure;
    (b) injecting a gas through the plurality of inclined nozzles formed in the stage housed in the enclosed chamber, while the pressure is maintained below atmospheric pressure, so that the article is transported in the direction of inclination of said inclined nozzles; and
    (c) treating the article by a chemical reaction with the gas used in said injecting step (b).

2. A method as set forth in claim 1, wherein the upper surface of the stage is horizontal.

3. A method as set forth in claim 1, wherein the upper surface of the stage is inclined in the direction of transportation of the article.

4. An apparatus for transporting an article in a vacuum, comprising:
    an enclosed chamber;
    exhaust means, connected to said enclosed chamber, for maintaining said enclosed chamber in the vacuum; and a stage, located in said enclosed chamber, for supporting the article, said stage including a plurality of inclined nozzles for injecting a gas while pressure in said enclosed chamber is reduced below atmospheric pressure, the article being transported and treated by a chemical reaction with said gas injected from said inclined nozzles.

5. An apparatus as set forth in claim 4, wherein said stage is inclined in the direction of transportation of the article.

* * * * *